US011309183B2

(12) United States Patent
Jisong

(10) Patent No.: US 11,309,183 B2
(45) Date of Patent: Apr. 19, 2022

(54) SEMICONDUCTOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jin Jisong, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 96 days.

(21) Appl. No.: 16/863,032

(22) Filed: Apr. 30, 2020

(65) Prior Publication Data

US 2021/0175080 A1 Jun. 10, 2021

(30) Foreign Application Priority Data

Dec. 4, 2019 (CN) .......................... 201911225397.3

(51) Int. Cl.
*H01L 21/033* (2006.01)
(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC .................................................. H01L 21/0337
See application file for complete search history.

(56) References Cited

U.S. PATENT DOCUMENTS

2017/0148637 A1* 5/2017 deVilliers ......... H01L 21/31144

\* cited by examiner

*Primary Examiner* — Walter H Swanson
(74) *Attorney, Agent, or Firm* — Crowell & Moring LLP

(57) ABSTRACT

A semiconductor structure and a forming method thereof are provided. The forming method includes: providing a base, where the base includes a first region; forming a bottom core material layer on the base; forming separate first core layers on the bottom core material layer of the first region; forming a first spacer on a side wall of the first core layer; removing the first core layer; after removing the first core layer, forming a second spacer on a side wall of the first spacer, where the first spacer and the second spacer located on the side wall of the first spacer constitute a main spacer structure layer; patterning the bottom core material layer by using the main spacer structure layer as a masking film to form a second core layer; removing the main spacer structure layer; after removing the main spacer structure layer, forming a third spacer on a side wall of the second core layer; removing the second core layer; and after removing the second core layer, patterning the base by using the third spacer as a masking film to form a desired pattern. Embodiments of the present disclosure can meet the demand of different types of pitches between the desired patterns, and are beneficial to accurately controlling the pitches between the desired patterns.

13 Claims, 12 Drawing Sheets

SEMICONDUCTOR STRUCTURE AND FORMING METHOD THEREOF

RELATED APPLICATIONS

The present application claims priority to Chinese Patent Appln. No. 201911225397.3, filed Dec. 4, 2019, the entire disclosure of which is hereby incorporated by reference.

BACKGROUND

Technical Field

Embodiments and implementations of the present disclosure relate to the field of semiconductor manufacturing, and in particular to a semiconductor structure and a forming method thereof.

Related Art

A photolithography technique is a commonly used patterning method and it is a most critical mass-production technique in industrial semiconductor manufacture. With the continuous shrinking of semiconductor technology nodes, self-aligned double patterning (SADP) method has become a popular patterning method in recent years. This method can increase the density of the patterns formed on the substrate, and further reduce pitches between two adjacent patterns, thereby enabling the photolithography process to overcome the limit of resolution in photolithography.

With the continuous reduction of the critical dimension (CD) of patterns, the self-aligned quadruple patterning (SAQP) method has emerged. The density of patterns formed on the substrate by the self-aligned double patterning method is twice the density of patterns formed on the substrate by the photolithography process, that is, a ½ minimum pitch can be obtained. However, on the premise of not changing the current photolithography technique, the density of patterns formed on the substrate by the self-aligned quadruple patterning method is four times the density of patterns formed on the substrate by the photolithography process, that is, a ¼ minimum pitch can be obtained, thereby greatly increasing the device density of the semiconductor integrated circuit, reducing the critical dimension of patterns, and further being beneficial to improving the device performance.

SUMMARY

The problem to be addresses in embodiments and implementations of the present disclosure is to provide a semiconductor structure and a forming method thereof, which can obtain various pitches between desired patterns.

To address the problem, embodiments and implementations of the present disclosure provides a forming method of a semiconductor structure, including: providing a base, where the base includes a first region; forming a bottom core material layer on the base; forming separate first core layers on the bottom core material layer of the first region; forming a first [Elaine1]spacer on a side wall of a first core layer of the separate first core layers; after forming the first spacer, removing the first core layer; after removing the first core layer, forming a second spacer on a side wall of the first spacer, where the first spacer and the second spacer located on the side wall of the first spacer constitute a main spacer structure layer; patterning the bottom core material layer by using the main spacer structure layer as a masking film to form a second core layer; after forming the second core layer, removing the main spacer structure layer; after removing the main spacer structure layer, forming a third spacer on a side wall of the second core layer; after forming the third spacer, removing the second core layer; and after removing the second core layer, patterning the base by using the third spacer as a masking film to form a desired pattern.

Accordingly, embodiments and implementations of the present disclosure further provides a semiconductor structure, including: a base, where the base includes a first region; a bottom core material layer, located on the base; a plurality of first spacers, located on the bottom core material layer; and a second spacer, located on a side wall of the first spacer, where the first spacer and the second spacer located on the side wall of the first spacer constitute a main spacer structure layer, and the main spacer structure layer is configured to serve as a masking film for patterning the bottom core material layer.

Compared with the prior art, technical solutions of embodiments and implementations of the present disclosure have the following advantages.

In the forming method of the semiconductor structure of embodiments and implementations of the present disclosure, the first spacer and the second spacer located on the side wall of the first spacer constitute the main spacer structure layer, the main spacer structure layer is configured to serve as the masking film for etching the bottom core material layer to form the second core layer, an subsequent step further includes forming the third spacer on the side wall of the second core layer, the third spacer is configured to serve as the masking film for patterning the base to form the desired pattern, and therefore, the dimension of the main spacer structure layer is configured to define a pitch between the third spacers, thereby defining a pitch between the desired patterns. According to embodiments and implementations of the present disclosure, by forming the first spacer and the second spacer, different types of dimensions of main spacer structure layers can be obtained by adjusting the dimensions of the first spacer and the second spacer and the positional relationship between the first spacer and the second spacer, thereby meeting the demand of different types of pitches between the formed desired patterns, and accordingly increasing the degree of freedom in designing the distribution of pitches of the desired patterns. Moreover, obtaining different dimensions of the main spacer structure layers by adjusting the dimensions of the first spacer and the second spacer and the positional relationship between the first spacer and the second spacer is also beneficial to reducing the difficulty in accurately controlling the pitches between the desired patterns.

DETAILED DESCRIPTION

It can be known from the background art that the use of an SAQP process is beneficial to increasing the density of patterns formed on a substrate. At present, the SAQP process is also usually configured to form fins of a fin field-effect transistor (FinFET). For example, the SAQP process is configured to form fins of a static random-access memory (SRAM).

However, as a process node continues scaling down, a pitch between the fins becomes smaller and smaller, and the cost of forming the fins of an SRAM device using the traditional SAQP process also becomes higher and higher. Hereby, the reason why the cost of forming the fins forming the SRAM device using the traditional SAQP process becomes higher and higher is analyzed in conjunction with a forming method of a semiconductor structure.

With reference to FIG. 1 to FIG. 9, schematic structural diagrams corresponding to steps in a forming method of a semiconductor structure are shown.

Figure 1:
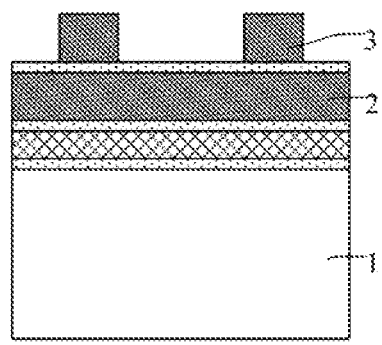
FIG. 1 to FIG. 9 are schematic structural diagrams corresponding to steps in a forming method of a semiconductor structure.

With reference to FIG. 1, a base 1 is provided. A core material layer 2 is formed on the base 1. Separate first core layers 3 are formed on the core material layer 2.

Figure 2:
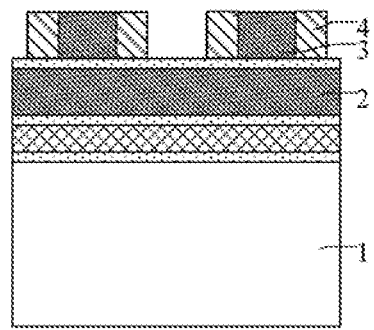

With reference to FIG. 2, first spacers 4 are formed on side walls of the first core layers 3.

Figure 3:
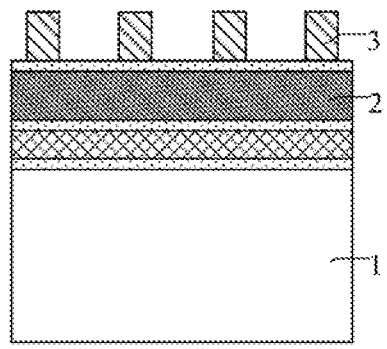

With reference to FIG. 3, the first core layers 3 are removed.

Figure 4:
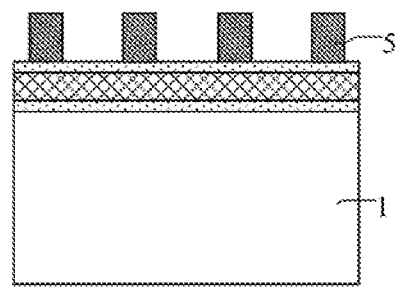

With reference to FIG. 4, after the first core layers 3 are removed, the core material layer 2 is patterned by using the first spacers 4 as masking films to form second core layers 5.

Figure 5:
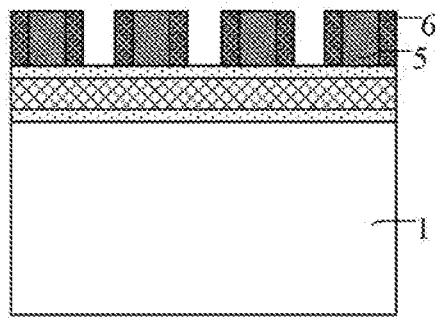

With reference to FIG. 5, second spacers 6 are formed on side walls of the second core layers 5.

Figure 6:
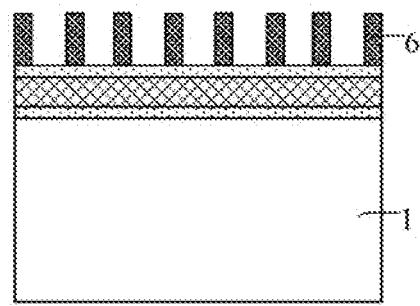

With reference to FIG. 6, the second core layers 5 are removed.

Figure 7:
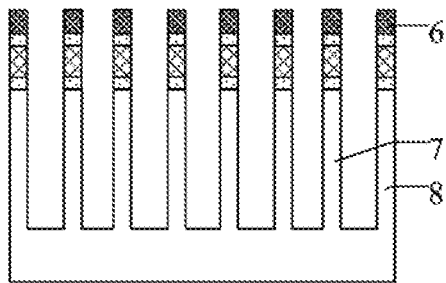

With reference to FIG. 7, after the second core layers 5 are removed, the base 1 is patterned using the second spacers 6 as masking films to form initial fins. The initial fins include spaced device fins 7 and dummy fins 8.

Figure 8:
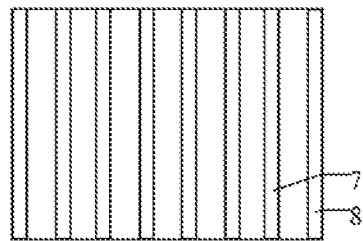

With reference to FIG. 8, a top view based on FIG. 7 is shown. After the initial fins are formed, the second spacers 6 are removed.

Figure 9:
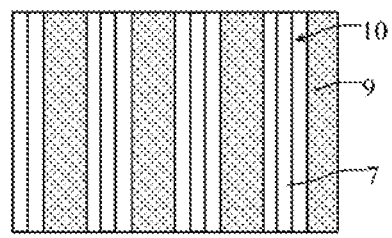

With reference to FIG. 9, a top view based on FIG. 8 is shown. The dummy fins 8 are removed. A step of removing the dummy fins 8 includes the following steps: masking film layers 9 are formed on the device fins 7, where a masking film opening 10 exposing the dummy fin 8 is formed in the masking film layer 9; and the dummy fins 8 exposed by the masking film openings 10 are removed by using the masking film layers 9 as masking films.

In the above forming method, a pitch between the masking film openings 10 is twice the pitch between the initial fins. As the process node continues scaling down, the pitch between the initial fins becomes smaller and smaller, and the pitch between the masking film openings 10 also becomes smaller and smaller. When the pitch between the masking film openings 10 is less than an exposure limit of a material of the masking film layer 9, two masks are required to form the masking film openings 10, which greatly increases the cost of forming the device fins. Alternatively, before the base is patterned, the second spacers corresponding to the positions of the dummy fins are removed. However, this method still does not solve the problem of excessive cost.

To address the above problem, another forming method of a semiconductor structure is provided at present, which does not need a fin cut or a step of removing a portion of the spacer. With reference to FIG. 10 to FIG. 15, schematic structural diagrams corresponding to steps in another forming method of a semiconductor structure are shown.

Figure 10:
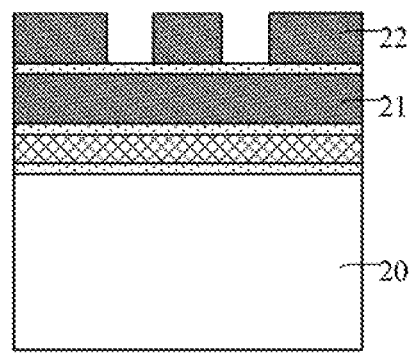
FIG. 10 to FIG. 15 are schematic structural diagrams corresponding to steps in another forming method of a semiconductor structure.

With reference to FIG. 10, a base 20 is provided. A core material layer 21 is formed on the base 20. Separate first core layers 22 are formed on the core material layer 21.

Figure 11:
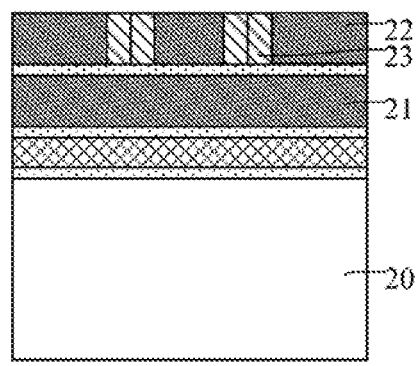

With reference to FIG. 11, first spacers 23 are formed on side walls of the first core layers 22, and the first spacers 23 located on side walls of the adjacent first core layers 22 are in contact.

Figure 12:
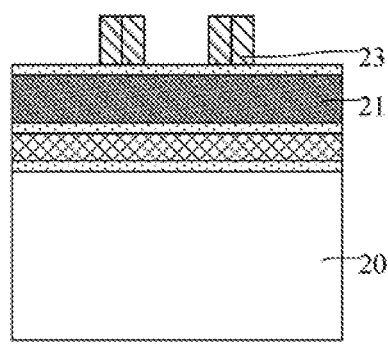
Figure 13:
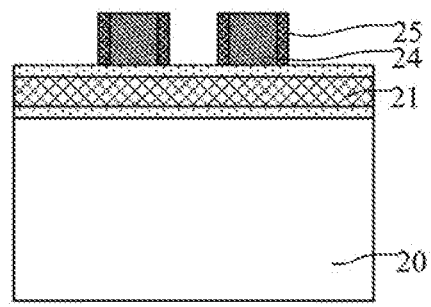

With reference to FIG. 12, the first core layers 22 are removed.

With reference to 13, after the first core layers 22 are removed, the core material layer 21 is patterned by using the first spacers 23 as masking films to form second core layers 24. Second spacers 25 are formed on side walls of the second core layers 24.

Figure 14:
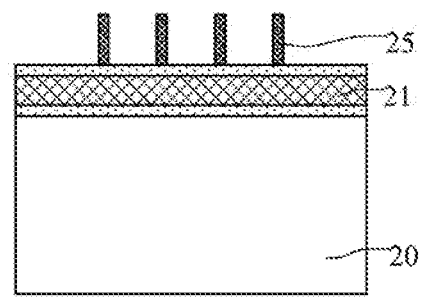

With reference to FIG. 14, the second core layers 24 are removed.

Figure 15:
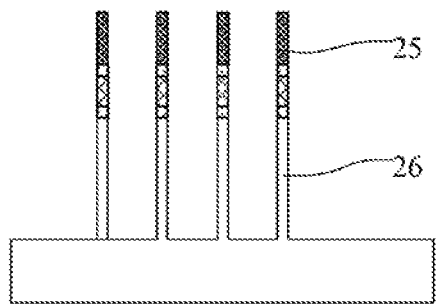

With reference to FIG. 15, after the second core layers 24 are removed, the base 20 is patterned by using the second spacers 25 as masking films to form fins 26.

In the above forming method, since the first spacers 23 located on the side walls of the adjacent first core layers 22 are in contact, a pitch between the second spacers 25 is large, and the pitch between the second spacers 25 corresponds to a pitch between the fins 26 that are finally formed, so that a fin cut or a step of removing a portion of the spacer is not required, thereby saving one mask, and being beneficial to saving the cost.

However, the types of the fin pitches formed by the forming method are relatively limited, and a degree of freedom of the types of the fin pitches formed is not high, so it is difficult to meet the demand for forming fins having more different types of pitches.

Alternatively, in order to form fins having more different types of pitches, an additional masking film is needed to cover a portion of a width of the first spacer, the portion of the width of the first spacer exposed by the masking film is removed to reduce the width of the portion of the first spacer, so that the plurality of first spacers have different widths, and the pitches between the formed second spacers are different accordingly. Or, in some methods, after the second core layers are formed, a masking film is added to cover a portion of a width of the second core layer with a mask, and the portion of the width of the second core layer exposed by the masking film is removed to reduce the width of the portion of the second core layer, so that the pitches between the second spacers are different accordingly. However, the above methods all need to add the mask, which also easily leads to an increase in the process cost.

In order to solve the technical problems, in the forming method of the semiconductor structure provided by the embodiments and implementations of the present disclosure, by forming the first spacer and the second spacer, different types of dimensions of the main spacer structure layers can be obtained by adjusting dimensions of the first spacer and the second spacer and a positional relationship between the first spacer and the second spacer, thereby meeting the demand of different types of pitches between formed desired patterns, and accordingly increasing the degree of freedom in designing the distribution of pitches of the desired patterns. Moreover, obtaining different dimensions of the main spacer structure layers by adjusting the dimensions of the first spacer and the second spacer and the positional relationship between the first spacer and the second spacer is also beneficial to reducing the difficulty in accurately controlling the pitch between the desired patterns.

In order to make the foregoing objectives, features and advantages of embodiments and implementations of the present disclosure more comprehensible, specific embodiments and implementations of the present disclosure are described in detail below in conjunction with the accompanying drawings.

FIG. 16 to FIG. 24 are schematic structural diagrams corresponding to steps in one form of a method for forming a semiconductor structure according to the present disclosure.

Figure 16:
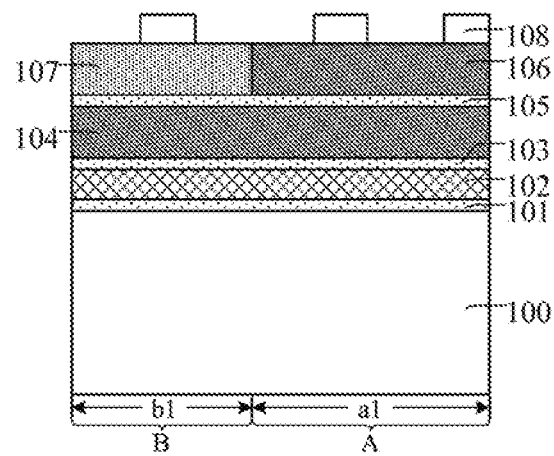
FIG. 16 to FIG. 24 are schematic structural diagrams corresponding to steps in one form of a method for forming a semiconductor structure according to the present disclosure.

With reference to FIG. 16, a base 100 is provided. The base 100 includes a first region A.

The base 100 is a layer to be etched in a patterning process that also provides a process platform for the manufacturing process. In the some implementations, the base 100 includes the first region A and a second region B. After a bottom core material layer is formed on the base 100 subsequently, separate first core layers and an anti-etching layer are also formed on the bottom core material layer. The method of forming the first core layers and the anti-etching layer includes a step of forming a top core material layer and an anti-etching material layer on the bottom core material layer. The top core material layer is configured to form the first core layers, the anti-etching material layer is configured to form an anti-etching layer, the first region A is configured to define a formation region of the top core material layer, and the second region B is configured to define a formation region of the anti-etching material layer.

In some implementations, the first region A and the second region B adjacent to each other are taken as an example. In other implementations, the first region and the second region may also not be adjacent.

In some implementations, the first region A includes a first sub-region a1, the first sub-region a1 includes first sub-core regions (not labeled) and first sub-space regions (not labeled) located between the adjacent first sub-core regions (not labeled), and the first sub-core region is configured to define a position of the first core layer subsequently formed on the first sub-core region.

In other implementations, the base may include only the first region and not the second region.

In some implementations, the second region B includes a third sub-region b1.

In some implementations, a material of the base 100 is silicon. In other implementations, the material of the base may also be another material such as germanium, silicon-germanium, silicon carbide, gallium arsenide, indium-gallium or the like. The base may also be another type of base such as a silicon base on an insulator, a germanium base on the insulator or the like. In still other implementations, the base may also include a first semiconductor layer and a second semiconductor layer epitaxially grown on the first semiconductor layer.

In the present implementations, the base 100 is configured to form a substrate and fins protruding from the substrate, that is, the formed desired patterns are the fins. In other implementations, the base may also be configured to form other types of patterns, such as interconnection trenches. Accordingly, in some implementations, the base further includes a metal interlayer dielectric layer. The metal interlayer dielectric layer in the base is configured to serve as a layer to be treated in the patterning process. In some implementations, the base may further include other structures, such as a gate structure, a doped region, a shallow trench isolation structure, and the like.

With continued reference to FIG. 16, a bottom core material layer 104 is formed on the base 100.

The bottom core material layer 104 is formed on the first region A and the second region B of the base 100.

The bottom core material layer 104 is configured to form a second core layer subsequently.

The second core layer may be removed subsequently, so the bottom core material layer 104 is of a material that can be easily removed, and the process of removing the second core layer has less damage to other film layers.

In some implementations, the material of the bottom core material layer 104 is amorphous silicon.

In other implementations, the material of the bottom core material layer may also be silicon nitride, amorphous germanium, silicon oxide, silicon oxynitride, carbon nitride, polysilicon, silicon carbide, silicon carbonitride or silicon oxycarbonitride.

In some implementations, before the bottom core material layer 104 is formed on the base 100, the forming method of the semiconductor structure further includes the following steps: a pad oxide layer 101 is formed on the base 100; a polishing stop layer 102 is formed on the pad oxide layer 101; and a first etch stop layer 103 is formed on the polishing stop layer 102.

In some implementations, after the base 100 is patterned subsequently to form the fins, a step of forming an isolation structure is also included. A top surface of the polishing stop layer 102 is used in a polishing process of forming the isolation structure to define a stop position of the polishing process. Moreover, after the second spacers are formed on the side walls of the first spacers subsequently, patterns of the first spacers and the second spacers may be firstly transferred into the polishing stop layer 102, and then transferred into the base 100 through the polishing stop layer 102, which is beneficial to improving the process stability of patterning the base 100.

In some implementations, a material of the polishing stop layer 102 is silicon nitride.

The pad oxide layer 101 is configured to provide a cushioning effect when the polishing stop layer 102 is formed. In some implementations, a material of the pad oxide layer 101 is silicon oxide.

Steps of patterning the bottom core material layer 104 to form the second core layer and forming third spacers on side walls of the second core layer are further included subsequently. The third spacers are usually formed by a combination process of deposition and etching. A top surface of the first etch stop layer 103 is configured to define stop positions of etching processes of patterning the bottom core material layer 104 and forming the third spacers so as to avoid the problem of over-etching, thereby reducing a probability that a height of atop surface of a film layer to be etched below the first etch stop layer 103 is not uniform.

In some implementations, a material of the first etch stop layer 103 is silicon oxide. In other implementations, depending on the material of the bottom core material layer, the material of the first etch stop layer may also be silicon nitride or silicon oxynitride.

In some implementations, after the bottom core material layer 104 is formed, the forming method of the semiconductor structure further includes that a second etch stop layer 105 is formed on the bottom core material layer 104.

Forming the first core layers subsequently usually includes an etching process, and the first spacers subsequently formed on the side walls of the first core layers and the second spacers formed on the side walls of the first spacers are usually formed by deposition and etching respectively. The etching process is also adopted to remove the first core layers subsequently. The second etch stop layer 105 is located on the bottom core material layer 104, and the second etch stop layer 105 can perform a function of defining etching stop positions in the etching process of forming the first core layers, forming the first spacers, forming the second spacers and removing the first core layers so as to avoid the problem of over-etching, thereby reducing a probability that a height of atop surface of the bottom core material layer 104 is not uniform. In some implementations, a material of the second etch stop layer 105 is silicon oxide.

Figure 17:
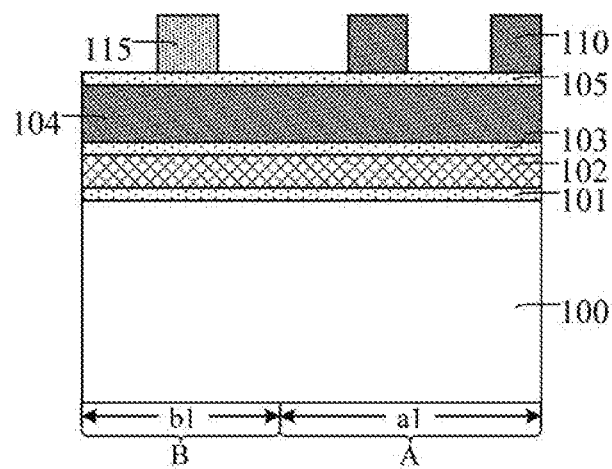

With reference to FIG. 17, separate first core layers 110 are formed on the bottom core material layer 104 of the first region A. In some implementations, the separate first core layers 110 are formed on the bottom core material layer 104 of the first sub-region a1.

Forming first spacers on side walls of the first core layers 110 is also included subsequently. The first core layers 110 are configured to perform a support function for forming the first spacers. A width dimension of the first core layers 110 and a space between the adjacent first core layers 110 are also configured to define a space between the subsequent first spacers.

A material of the first core layer 110 may be amorphous silicon, silicon nitride, amorphous germanium, silicon oxide, silicon oxynitride, carbon nitride, polysilicon, silicon carbide, and silicon carbonitride or silicon oxycarbonitride. In some implementations, the material of the first core layer 110 is amorphous silicon.

In some implementations, in the process of forming the separate first core layers 110 on the bottom core material layer 104 of the first region A, an anti-etching layer 115 separate from the first core layers 110 is formed on the bottom core material layer 104 of the second region B, and an etching resistance of the anti-etching layer 115 is greater than an etching resistance of the first core layer 110.

The etching resistance of the anti-etching layer 115 is greater than the etching resistance of the first core layer 110, so that in the step of forming the first spacers on the side walls of the first spacers 115, the first spacers are also formed on side walls of the anti-etching layer 115, and the anti-etching layer 115 can be retained in the step of removing the first core layers 110 subsequently. Therefore, the second spacers are not formed on the side wall surface of the first spacer in contact with the anti-etching layer 115 subsequently, so that by forming the anti-etching layer 115, different types of dimensions of main spacer structure layers can be obtained by adjusting the dimensions of the first spacer and the second spacer and the positional relationship between the first spacer and the second spacer, thereby further increasing the types of pitches between the desired patterns and increasing the degree of freedom in designing the types of pitches of the desired patterns.

A material of the anti-etching layer 115 includes amorphous silicon, silicon nitride, amorphous germanium, silicon oxide, silicon oxynitride, carbon nitride, polysilicon, silicon carbide, silicon carbonitride or silicon oxycarbonitride. In some implementations, the material of the anti-etching layer 115 is amorphous silicon.

In some implementations, the anti-etching layer 115 is formed on the third sub-region b1.

In some implementations, only one anti-etching layer 115 being formed on the second region B is taken as an example. In other implementations, a number of the anti-etching layers may also be plural.

In some implementations, the step of forming the first core layers 110 the anti-etching layer 11, is listed as below.

As shown in FIG. 16, an anti-etching material layer 107 located on the second region B and a top core material layer 106 located on the first region A are formed on the bottom core material layer 104, and an etching resistance of the anti-etching material layer 107 is greater than an etching resistance of the top core material layer 106.

The anti-etching material layer 107 is configured to form the anti-etching layer. The top core material layer 106 is configured to form the first core layers. The etching resistance of the anti-etching material layer 107 is greater than an etching resistance of the top core material layer 106, so that an etching resistance of the anti-etching layer is greater than an etching resistance of the first core layer.

In some implementations, a step of forming the top core material layer 106 and the anti-etching material layer 107 is listed as below: an initial core material layer is formed on the bottom core material layer 104; and an ion doping treatment is performed on the initial core material layer of the second region B, which is suitable for increasing an etching resistance of the initial core material layer of the second region B. The initial core material layer doped with ions and located on the second region B serves as the anti-etching material layer 107, and the initial core material layer not doped with ions but located on the first region A serves as the top core material layer 106.

In some implementations, doping ions of the ion doping treatment include boron ions, phosphorus ions or argon ions.

In some implementations, an ion implantation process is adopted to perform the ion doping treatment.

In other implementations, an ion doping treatment may also be performed on the initial core material layer of the first region, which is suitable for decreasing an etching resistance of the initial core material layer of the first region. The initial core material layer doped with ions and located on the first region serves as the top core material layer, and the initial core material layer not doped with ions but located on the second region serves as the anti-etching material layer.

As shown in FIG. 17, the top core material layer 106 and the anti-etching material layer 107 are patterned, the remaining top core material layer 106 serves as the first core layer 115, and the remaining anti-etching material layer 107 serves as the anti-etching layer 115.

Before the top core material layer 106 and the anti-etching material layer 107 are patterned, the forming method of the semiconductor structure further includes that pattern layers 108 are formed on the top core material layer 106 and the anti-etching material layer 107 (as shown in FIG. 16).

The pattern layers 108 are configured to serve as masking films for patterning the top core material layer 106 and the anti-etching material layer 107. In some implementations, a material of the pattern layers 108 is spin-on carbon (SOC). Therefore, the top core material layer 106 and the anti-etching material layer 107 are patterned by using the pattern layers 108 as the masking films.

After the first core layers 110 and the anti-etching layer 115 are formed, the pattern layers 108 are removed.

Specifically, an aching process may be adopted to remove the pattern layers 108.

Figure 18:
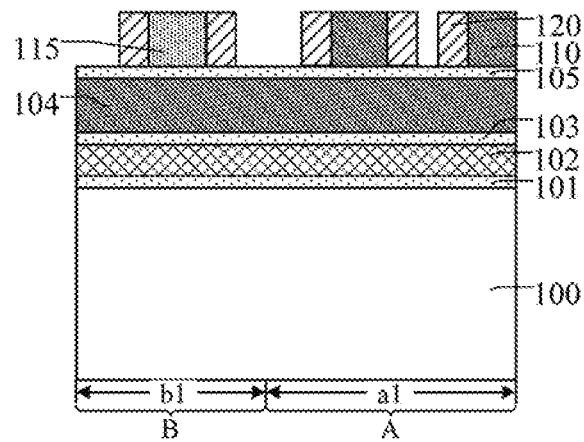

With reference to FIG. 18, first spacers 120 are formed on side walls of the first core layers 110.

In some implementations, in the step of forming the first spacers 120, the first spacers 120 formed on the side walls of the first core layers 110 of the first sub-region a1 are separate from each other.

The first spacers 120 are configured to constitute a main spacer structure layer together with the second spacers subsequently formed on the side walls of the first spacer 120, thereby serving as the masking film for patterning the bottom core material layer 104.

A material of the first spacer 120 may be titanium oxide, titanium nitride, silicon oxide, silicon nitride or aluminum oxide. In some implementations, the material of the first spacer 120 is titanium oxide. The titanium oxide material and the amorphous silicon material have higher etch selectivity, so that the first spacers 120 can be retained in the step of removing the first core layers 110 subsequently, and the first spacers 120 can serve as the masking films for patterning the bottom core material layer 104.

In some implementations, in the step of forming the first spacers 120, the first spacers 120 formed on the side walls of the first core layers 110 of the first sub-region a1 are separated from each other.

In some implementations, the number of the first spacers 120 formed on the first sub-region a1 being three is taken as an example. In other implementations, the number of the first spacers respectively formed in the first sub-region may be different.

In some implementations, the anti-etching layer 115 separate from the first core layers 110 is also formed on the bottom core material layer 104 of the second region B. Therefore, in the process of forming the first spacers 120 on the side walls of the first core layers 110, the first spacers 120 are also formed on side walls of the anti-etching layer 115.

In some implementations, in the step of forming the first spacer 120, the first spacers 120 formed on side walls of the anti-etching layer 115 of the third sub-region b1 are also separate from each other.

The step of forming the first spacers 120 is listed as below: first spacer films, located on side walls and top surfaces of the first core layers 110 and the anti-etching layer 115 and a surface of the second etch stop layer 105, are formed; and the first spacer films located on the top surfaces of the first core layers 110 and the anti-etching layer 115 and the surface of the second etching stop layer 105 are removed, and the remaining first spacer films located on the side walls of the first core layers 110 and the anti-etching layer 115 serve as the first spacers 120.

In some implementations, an atomic layer deposition process is adopted to form the first spacer films, thereby being beneficial to improving the covering power of the first spacer films on the side walls of the first core layers 110 and the anti-etching layer 115, and also being beneficial to improving the thickness uniformity of the first spacer films and lowering the difficulty in accurately controlling the thickness of the first spacer films.

In some implementations, an anisotropic dry etching process is adopted to remove the first spacer films on the top surfaces of the first core layers 110 and the anti-etching layer 115 and the surface of the second etch stop layer 105. The anisotropic dry etching process has the characteristic of anisotropic etching, so that the first spacer films on the top surfaces of the first core layers 110 and the anti-etching layer 115 and the surface of the second etching stop layer 105 can be removed without a masking film and the first spacer films on the side walk of the first core layers 110 and the anti-etching layer 115 are retained.

Figure 19:
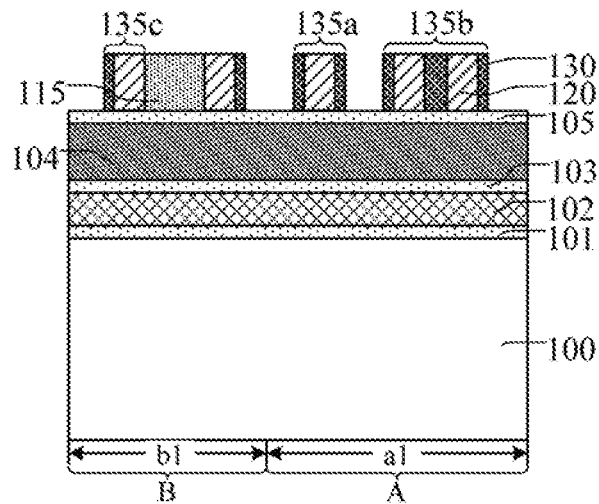

With reference to FIG. 19, after the first spacers 120 are formed, the first core layers 110 are removed. After the first core layers 110 are removed, second spacers 130 are formed on side walls of the first spacers 120. The first spacer 120 and the second spacers 130 located on the side walls of the first spacer 120 constitute a main spacer structure layer 135.

The first core layer 110 is removed to expose the side walls where the first spacers 120 are in contact with the first core layer 110, so that on the first region A, the second spacers 130 can be formed on side wall surfaces on two sides of the first spacer 120.

In some implementations, before the second spacers 130 are formed, the anti-etching layer 115 is retained. Specifically, in the step of removing the first core layers 110, the anti-etching layer 115 is retained.

In some implementations, a process of removing the first core layers 110 includes a wet etching process. The wet etching process has the advantages of lower cost and simple operation steps, and can achieve larger etch selectivity.

In some implementations, the step of forming the top core material layer 106 and the anti-etching material layer 107 is listed as below: an ion doping treatment is performed on the initial core material layer of the second region B, which is suitable for increasing the etching resistance of the initial core material layer of the second region B.

Therefore, an etching solution of the wet etching process includes an SC1 solution, an SC2 solution or a TMAH (Tetra-methyl-ammonium hydroxide) solution, which is an etching solution often used for etching amorphous silicon in a semiconductor process, and is beneficial to improving the process compatibility. Moreover, the above etching solution has a low etching rate for amorphous silicon doped with boron ions, argon ions or phosphorus ions, so that the anti-etching layer 115 is retained in the step of removing the first core layers 110. The SC1 solution refers to a mixed solution of ammonia ($NH_4OH$) and hydrogen peroxide ($H_2O_2$), and the SC2 solution refers to a mixed solution of hydrochloric acid (HCl) and hydrogen peroxide ($H_2O_2$).

In other implementations, when the step of forming the anti-etching layer and the first core layers includes performing an ion doping treatment on the initial material layer of the first region, which is suitable for decreasing the etching resistance of the initial core material layer of the first region, and other suitable etching solutions are adopted to remove the first core layers accordingly.

The first spacer 120 and the second spacer 130 located on the side wall of the first spacer 120 constitute the main spacer structure layer, the main spacer structure layer is configured to serve as the masking film for etching the bottom core material layer 104 to form the second core layer, an subsequent step further includes forming the third spacer on the side wall of the second core layer, the third spacer is configured to serve as the masking film for patterning the base 100 to form the desired pattern, and therefore, the dimension of the main spacer structure layer is configured to define a pitch between the third spacers, thereby defining a pitch between the desired patterns. In some implementations, by forming the first spacer 120 and the second spacer 130, different types of dimensions of main spacer structure layers can be obtained by adjusting the dimensions and the positional relationship of the first spacer 120 and the second spacer 130, thereby meeting the demand of different types of pitches between the formed desired patterns, and accordingly increasing the degree of freedom in designing the types of pitches of the desired patterns. Moreover, obtaining different dimensions of the main spacer structure layers by adjusting the dimensions and the positional relationship of the first spacer 120 and the second spacer 130 is also beneficial to reducing the difficulty in accurately controlling the pitch between the desired patterns.

A material of the second spacer 130 includes titanium oxide, titanium nitride, silicon nitride, aluminum oxide or silicon oxide.

In some implementations, the material of the second spacer 130 is the same as the material of the first spacer 120. The material of the second spacer 130 is titanium oxide to avoid introducing other spacer materials, thereby being beneficial to improving the process compatibility and reducing the process changes. Moreover, the main spacer structure layer may include only one material, which is beneficial to improving the effect of the process of etching the bottom core material layer 104 by using the main spacer structure layer as the masking film subsequently and improving the accuracy of pattern transfer.

In other implementations, the material of the second spacer may also be different from the material of the first spacer.

In the step of forming the second spacers 130, the second spacers 130 formed on the first sub-core regions are separate from each other, and the second spacers 130 formed on the same first sub-space region are in contact.

In some implementations, after the first core layers 110 are removed and the anti-etching layer 115 is retained, the second spacers 130 are formed on the exposed side walls of the first spacer 120, the first spacer 120 and the second spacers 130 located on the side walls of the first spacer 120 constitute the main spacer structure layer.

After the second spacers 130 are formed on the side walls of the first spacer 120, the main spacer structure layer is also located on the second region B. Specifically, in some implementations, the main spacer structure layer is located on the third sub-region b1.

Therefore, in some implementations, there are three types of main spacer structure layers, such as first type spacer structure layers 135a, second type spacer structure layers 135b and third type spacer structure layers 135c.

The main spacer structure layers on the first sub-regional are respectively the first type spacer structure layers 135a and the second type spacer structure layers 135b, and the first type spacer structure layers 135a and the second type spacer structure layers 135b are separated from each other.

In some implementations, on the first sub-region a1, in the step of forming the second spacers 130, the first spacers 120 formed on the side walls of the second spacers 130 are separate from each other. Any one of the first type spacer structure layers 135a includes one first spacer 120 and second spacers 130 located on side wall surfaces on two sides of the first spacer 120.

When the number of the first type spacer structure layers 135a is plural, the first type spacer structure layers 135a are separate from each other. That is, when the number of the first type spacer structure layers 135a is plural, the second spacers 130 between the first type spacer structure layers 135a are also separate from each other.

In some implementations, any one of the second type spacer structure layers 135b includes two adjacent first spacers 120 and second spacers 130 respectively located on side wall surfaces on two sides of each first spacer 120, and for any one of the second type spacer structure layers 135b, the second spacers 130 located on the side walls of the first spacers 120 between the adjacent first spacers 120 are in contact. In the second type spacer structure layer 135b, the second spacers 130 between the adjacent first spacers 120 correspond to the second spacers 130 on the same first sub-space region.

It should be noted that a space between the adjacent first spacers 120 in the second type spacer structure layer 135b is less than or equal to twice the width of the second spacer 130 in the first type spacer structure layer 135a.

When the number of the second type spacer structure layer 135b is plural, the second type spacer structure layers 135b are separate from each other.

Compared with the first type spacer structure layer 135a, the second type spacer structure layer 135b has a greater width. The second type spacer structure layer 135b and the first type spacer structure layer 135a have different width dimensions, so that the main spacer structure layers have different types of width dimensions.

In some implementations, since the anti-etching layer 115 is retained in the step of removing the first core layers 110, the second spacer 130 may not be formed on the side wall where the first spacer 120 is in contact with the anti-etching layer 115 in the step of forming the second spacer 130. That is, the second spacer 130 is located on the side wall where the first spacer 120 is opposite to the anti-etching layer 115.

In some implementations, the first spacers 120 formed on the side walls of the anti-etching layer 115 of the third sub-region are separate from each other. In the step of forming the second spacer 130, the second spacers 130 located on the side walls of the first spacer 120 of the second region B are also separate from each other. Specifically, the second spacers 120 formed on the side walls of the first spacer 120 of the third sub-region b1 are separate from each other.

Therefore, in some implementations, the main spacer structure layers located on the third sub-region b1 serve as the third type spacer structure layers 135c, and any one of the third type spacer structure layers 1135c includes one first spacer 120 and a second spacer 130 located on a side wall surface on one side of the first spacer 120.

Compared with the first type spacer structure layer 135a, the third type spacer structure layer 135c has a smaller width dimension. That is, the width dimension of the third type spacer structure layer 135c is different from that of the first type spacer structure layer 135a and the second type spacer structure layer 135b, so that more types of width dimensions of the main spacer structure layers can be obtained by retaining the anti-etching layer 115 before forming the second spacer 130.

In some implementations, the step of forming the second spacer 130 is listed as below: second spacer films, located on side walls and a top surface of the first spacer 120, a surface of the second etch stop layer 105 and a top surface of the anti-etching layer 115, are formed; and the second spacer films located on the top surfaces of the first spacer 120 and the anti-etching layer 115 and the surface of the second etch stop layer 105 are removed, and the remaining second spacer films located on the side walls of the first spacer 120 serve as the second spacers 130.

In some implementations, an atomic layer deposition process is adopted to form the second spacer film, which is beneficial to improving the conformal covering power of the second spacer film and enables the thickness of the second spacer film to be accurately controlled. As the deposition thickness of the second spacer film material increases, the materials of the second spacer films located on the side walls of the adjacent first spacer 120 between the first sub-core regions (that is, the same first sub-space region) gradually come into contact, so that the gap located between the adjacent first spacers 120 between the first sub-core regions is fully filled, and thus, the second spacers 130 formed on the same first sub-space region are in contact.

In some implementations, a dry etching process, such as an anisotropic dry etching process, is adopted to remove the second spacer films located on the top surfaces of the first spacer 120 and the anti-etching layer 115 and the surface of the second etch stop layer 105.

In some implementations, the first type spacer structure layer 135*a*, the second type spacer structure layer 135*b* and the third type spacer structure layer 135*c* are respectively formed by combining the width dimensions and the positional relationship of the first spacer 120 and the second spacer 130. The above is taken as an example. In other implementations, according to the actual process, other types of main spacer structure layers may also be obtained by adjusting the width dimensions and the positional relationship of the first spacer and the second spacer.

In some implementations, only the width of the second spacer 130 being less than the width of the first spacer 120 is taken as an example for description.

Figure 20:
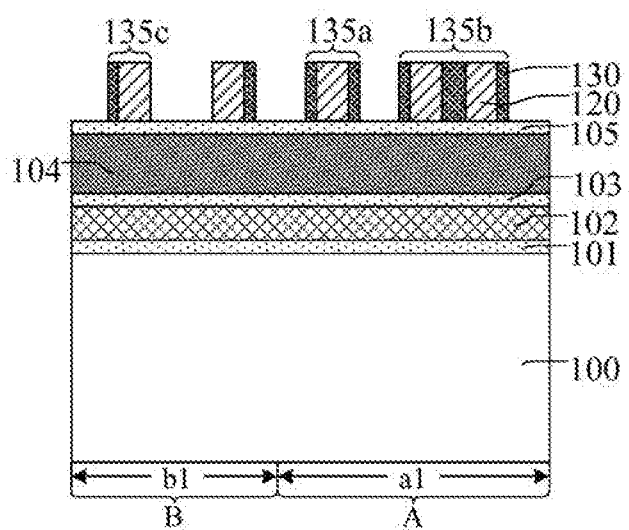

With reference to FIG. 20 in combination, after the second spacers 130 are formed on the side walls of the first spacer 120, before the bottom core material layer 104 is patterned, the forming method of the semiconductor structure further includes removing the anti-etching layer 115.

Removing the anti-etching layer 115 makes preparations for etching the bottom core material layer 104 by using the main spacer structure layer composed by the first spacer 120 and the second spacer 130 subsequently.

In some implementations, a dry etching process is adopted to remove the anti-etching layer 115. The use of the dry etching process is beneficial to achieving larger etch selectivity by adjusting the etching gas type, process parameters and the like, thereby reducing damage to other film layer structures (for example, the first spacer 120 and the second spacer 130) in the process of removing the anti-etching layer 115.

Figure 21:
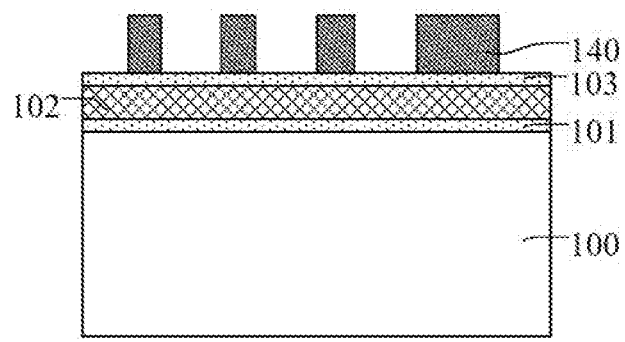

With reference to FIG. 21, the bottom core material layer 104 is patterned using the main spacer structure layers as masking films to form second core layers 140.

A subsequent step further includes forming third spacers on side walls of the second core layer 140. The second core layer 140 is configured to provide a support function for forming the third spacers, and a width dimension of the second core layer 140 is also configured to define a pitch between the third spacers, thereby defining a pitch between the subsequent desired patterns.

In some implementations, a second etch stop layer 105 is also formed on the bottom core material layer 104. Therefore, before the bottom core material layer 104 is patterned, the second etch stop layer 105 is also etched by using the main spacer structure layer as the masking film.

In some implementations, a dry etching process, such as an anisotropic dry etching process, is adopted to etch the bottom core material layer 104, thereby achieving the patterning of the bottom core material layer 104. The anisotropic dry etching process has the characteristic of anisotropic etching, and has good control on the etch profile, which is beneficial to improving the accuracy of pattern transfer.

Figure 22:
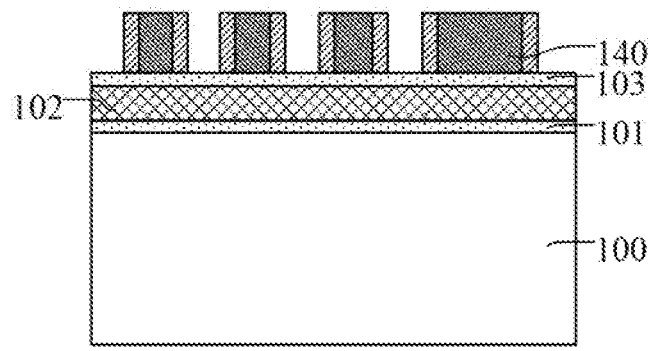

With reference to FIG. 21 and FIG. 22, the main spacer structure layer is removed. After the main spacer structure layer is removed, the third spacers 150 are formed on the side walls of the second core layer 140.

In some implementations, when the main spacer structure layer is removed, the remaining second etch stop layer 105 on the second core layer 140 is also removed. In some implementations, a dry etching process is adopted to remove the spacer structure layer 135 and the second etch stop layer 105.

The third spacers 150 are configured to serve as masking films for patterning the base 100 to form the desired patterns, and therefore, a pitch between the third spacers 150 is configured to define a pitch between the subsequent desired patterns.

The pitch between the third spacers 150 is defined by the dimensions of the main spacer structure layers, and different types of dimensions of main spacer structure layers can be obtained by adjusting the dimensions of the first spacer 120 and the second spacer 130 and the positional relationship between the first spacer 120 and the second spacer 130 in some implementations, so that the third spacers 150 have various pitches therebetween, and thus, the formed desired patterns have pitches of different types therebetween, thereby increasing the degree of freedom in designing the distribution of pitches between the desired patterns.

A material of the third spacer 150 may be titanium oxide, titanium nitride, silicon oxide, silicon nitride or aluminum oxide.

In some implementations, the material of the third spacer 150 is titanium oxide. The titanium oxide material and the amorphous silicon material have larger etch selectivity, so that the third spacers 150 can be retained in the step of removing the second core layers 140 subsequently, and the third spacers 150 can serve as the masking films for patterning the base 100.

In some implementations, for the specific step of forming the third spacers 150, reference may be made to the foregoing detailed description of the step of forming the first spacers 120, and details are omitted herein.

In some implementations, the third spacers 150 are separate from each other.

Figure 23:
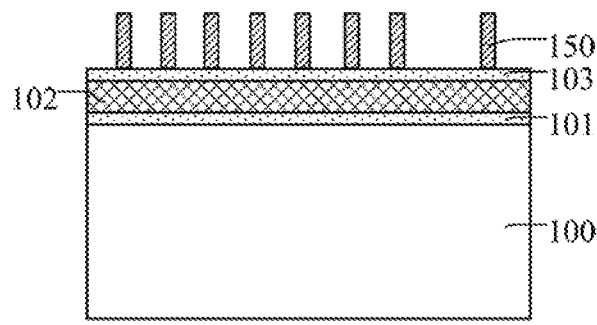
Figure 24:
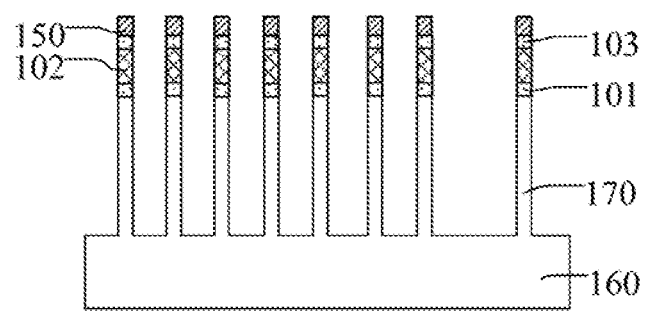

With reference to FIG. 23 to FIG. 24, after the third spacers 150 are formed, the second core layers 140 are removed. After the second core layers 140 are removed, the base 100 is patterned by using the third spacers 150 as masking films to form the desired patterns.

The second core layers 140 are removed to expose the first etch stop layer 103 at the bottom of the second core layers 140, thereby making preparations for patterning the base 100 by using the third spacers 150 as masking films subsequently.

In some implementations, the process of removing the second core layers 140 is the same as the aforementioned process of removing the first core layers 110, and is omitted herein.

In some implementations, the desired patterns are fins 200. The base 100 is patterned using the third spacers 150 as masking films to form the fins 170. The remaining base 100 serves as the substrate 160 and the fins 170 correspondingly protrude from the substrate 160.

The third spacers 150 have pitches of different types therebetween, and thus, the fins 170 also have pitches of different types therebetween, thereby increasing the degree of freedom in designing the pitches between the fins 170, and being beneficial to accurately controlling the pitches between the fins 170.

In some implementations, the base 100 being patterned to form the fins 170 is taken as an example. In other implementations, the desired patterns may also be other types of patterns. For example, the base is patterned by using the third spacers as the masking films to form interconnection trenches. The remaining base located between the side walls of the interconnection trenches serves as an isolation layer, and therefore, the desired pattern may be the isolation layer. The isolation layers have pitches of different types therebetween That is, interconnection trenches having multiple types of width dimensions may be formed, and accordingly, interconnection lines subsequently formed in the interconnection trenches also have multiple types of width dimensions therebetween.

In some implementations, the step of patterning the base 100 by using the third spacers 150 as the masking films includes that the first etch stop layer 103, the polishing stop layer 102, the pad oxide layer 101 and the base 100 with a portion of thickness are sequentially etched by using the third spacers 150 as the masking films.

In some implementations, the patterns of the third spacers 150 are firstly transferred into the polishing stop layer 102, and then transferred into the base 100 through the polishing stop layer 102. Even if the third spacers 150 are completely consumed in the process of patterning the base 100, the polishing stop layer 102 can still serve as a masking film for etching the base 100, thereby being beneficial to enhancing the process stability of patterning the base 100.

In some implementations, a dry etching process, such as an anisotropic dry etching process, is adopted to sequentially etch the first etch stop layer 102, the polishing stop layer 102, the pad oxide layer 101 and the base 100 with a portion of thickness. The anisotropic dry etching process has the advantages of good control on etch profile and high etching accuracy, and is beneficial to improving the accuracy of pattern transfer and improving the pattern quality and profile shape quality of the desired pattern.

In some implementations, after the base 100 is patterned, the third spacer 150 with a portion of thickness is still retained on the fin 170. In other implementations, the third spacer may also be consumed in the process of patterning the base.

Accordingly, after the fins 170 are formed, the subsequent process step further includes removing the third spacers 150.

The subsequent process step is omitted in some implementations.

Figure 25:
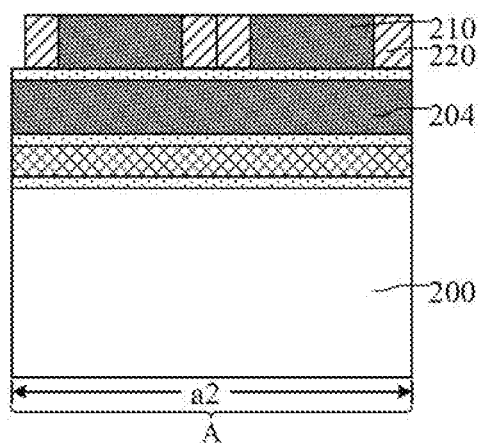
FIG. 25 to FIG. 27 are schematic structural diagrams corresponding to steps in one form of a method for forming a semiconductor structure according to the present disclosure.
Figure 26:
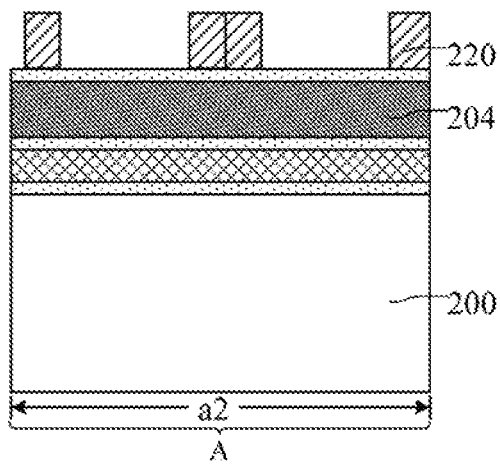
Figure 27:
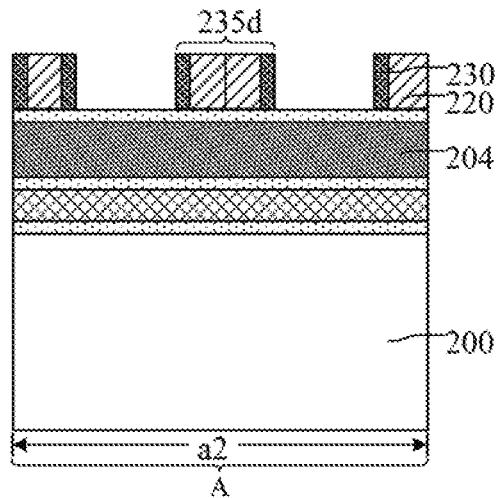

FIG. 25 to FIG. 27 are schematic structural diagrams corresponding to steps in another form of a forming method of a semiconductor structure according to the present disclosure.

The similarities between implementations described below and the aforementioned embodiments and implementations are omitted here. The implementations described below are different from the implementations described above in that: the first region includes first sub-regions and second sub-regions; in the process of forming the first core layers, a plurality of the first core layers are also formed on the second sub-regions; in the step of forming the first spacers, the first spacers formed between the adjacent first core layers on the second sub-region and located on side wall surfaces of the first core layers are in contact; and the main spacer structure layers on the second sub-regions are fourth type spacer structure layers, any one of the fourth type spacer structure layers includes second spacers and two first spacers in contact, and the second spacers are respectively located on side wall surfaces on two sides of the two first spacers in contact as a whole. For the formation process and structure on the first sub-region, reference is made to the foregoing embodiments, and details are omitted here.

With reference to FIG. 25, first spacers 220 are formed on side walls of the first core layers 210.

In some implementations, the first region A includes second sub-regions a2.

In some implementations, the first spacers 220 formed between the adjacent first core layers 210 on the second sub-region a2 and located on side wall surfaces of the first core layers 210 are in contact.

By making the first spacers 220 located on the side walls of the adjacent first core layers 210 be in contact, the second spacers can only be respectively formed on the side wall surfaces on two sides of the two first spacers 220 in contact as a whole subsequently, thereby obtaining the main spacer structure layer having a different type of width dimension from that in the aforementioned embodiment.

In some implementations, in the step of forming the first spacers 220, a width of the first spacers 220 (for example, the first spacer 220 on the leftmost side in FIG. 25) that are formed on the side walls of the first core layers 210 and are separate from each other is defined as a first width.

It should be noted that a space between the adjacent first core layers 210 on the second sub-region a2 is less than or equal to twice the first width.

For the related description of the first spacers 220, reference is made to the corresponding description in the foregoing embodiments, and details are omitted here in some implementations.

It should be noted that, for convenience of illustration and description, only a schematic structural diagram of the second sub-region a2 in the first region A corresponding to steps in the forming method of the semiconductor structure in some implementations is illustrated.

With reference to FIGS. 26 to 27, after the first spacers 220 are formed, the first core layers 210 are removed. After the first core layers 210 are removed, second spacers 230 are formed on side walls of the first spacers 220. The first spacer 220 and the second spacers 230 located on the side walls of the first spacer 220 constitute a main spacer structure layer.

The first core layers 210 are removed to expose the side walls of the first spacer 220, thereby providing a spatial position for forming the second spacers on the side walls of the first spacer 220.

In some implementations, the main spacer structure layers formed on the second sub-region a2 are fourth type spacer structure layers 235d, and any one of the fourth type spacer structure layers 235d includes second spacers 230 and two first spacers 220 in contact.

In some implementations, the first spacers 220 formed between the adjacent first core layers 210 on the second sub-region a2 and located on side wall surfaces of the first core layers 210 are in contact, and therefore, the second spacers 230 formed on the second sub-region a2 are respectively located on side wall surfaces on two sides of the two first spacers 220 in contact as a whole.

Accordingly, the width dimension of the fourth type spacer structure layer 235d is different from the width dimensions of the first type spacer structure layer, the second type spacer structure layer and the third type spacer structure layer in the aforementioned embodiments, thereby further increasing the types of width dimensions of the main spacer structure layers.

Accordingly, after a bottom core material layer 204 is patterned to form the second core layers by using the fourth type spacer structure layers 235d as masking films and third spacers are formed on the side walls of the second core layers subsequently, a pitch between the third spacers is also different from the pitch between the third spacers in the aforementioned embodiment, so that the desired patterns formed by patterning the base 200 by using the third spacers as masking films subsequently have more types of width dimensions therebetween.

In some implementations, the material of the second spacers 230 and the step of forming the second spacers 230 are the same as those in the implementations described above, and are omitted here.

The subsequent process steps are the same as those in the implementations described above, and are omitted in some implementations.

In other implementations, the first region may include the first sub-regions but not include the second sub-regions, or the first region may include the second sub-regions but not include the first sub-regions.

Figure 28:
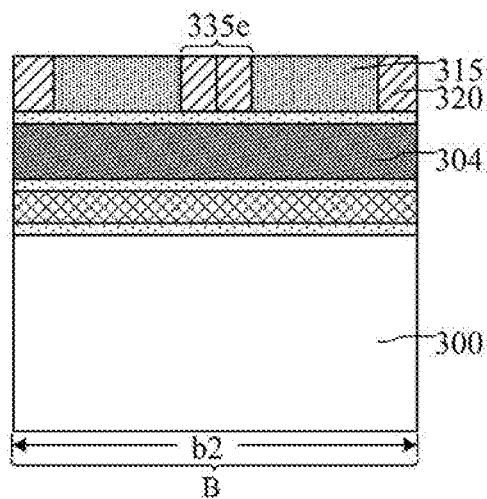
FIG. 28 to FIG. 29 are schematic structural diagrams corresponding to steps in one form of a method for forming a semiconductor structure according to the present disclosure.
Figure 29:
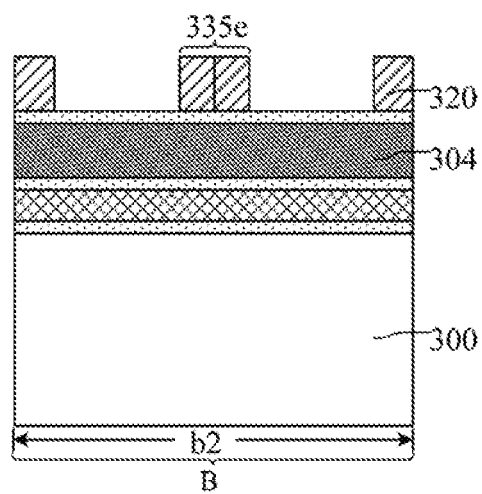

FIG. 28 to FIG. 29 are schematic structural diagrams corresponding to steps in still another form of a forming method of a semiconductor structure according to the present disclosure.

The similarities between the implementations described below and the implementations described below are omitted here. The implementations described below are different from the implementations described above in that: the second region includes third sub-regions and fourth sub-regions, the fourth sub-region includes fourth sub-anti-etching regions and a fourth sub-space region located between the adjacent fourth sub-anti-etching regions, and the fourth sub-anti-etching region is configured to define a position of the anti-etching layer on the fourth sub-anti-etching region; in the step of forming the first spacers, the first spacers formed between the adjacent anti-etching layers on the fourth sub-region and located on side wall surfaces of the anti-etching layer are in contact; and in the process of forming the main spacer structure layer, an additional spacer structure layer is also formed on the fourth sub-region, and any one of the additional spacer structure layers includes the first spacers in contact on the fourth sub-space region. For the formation process and structure on the third sub-region, reference is made to the foregoing embodiments, and details are omitted here.

With reference to FIG. 28, first spacers 320 are formed on side walls of the first core layers (not shown).

In some implementations, the second region B further includes a fourth sub-region b2, the fourth sub-region b2 includes fourth sub-anti-etching regions (not labeled) and fourth sub-space regions (not labeled) located between the adjacent fourth sub-anti-etching regions, and the fourth sub-anti-etching region is configured to define a position of the anti-etching layer on the fourth sub-anti-etching region.

In some implementations, an anti-etching layer 315 separate from the first core layers is formed on a bottom core material layer 304 of the second region B. Accordingly, the first spacers 320 are also formed on side walls of the anti-etching layer 315.

In some implementations, the first spacers 320 formed between the adjacent anti-etching layers 315 on the fourth sub-region b2 and located on side wall surfaces of the anti-etching layer 315 are in contact. Specifically, the fourth sub-space region has the first spacers 320 in contact thereon.

In some implementations, in the step of forming the first spacers 320, a width of the first spacers 320 that are formed on the side walls of the anti-etching layer 315 and are separate from each other is defined as a second width.

It should be noted that a space between the adjacent anti-etching layers 315 on the fourth sub-region b2 is less than or equal to twice the second width.

For the description of the first spacers 320, reference may be made to the related description of the foregoing embodiments, and details are omitted here.

It should be noted that, for convenience of illustration and description, only a schematic structural diagram of the fourth sub-region b2 in the second region B corresponding to steps in the forming method of the semiconductor structure in some implementations is illustrated.

With continued reference to FIG. 28, after the first spacers 320 are formed, the first core layers are removed. After the first core layers are removed, second spacers (not shown) are formed on side walls of the first spacers 320. The first spacer 320 and the second spacers located on the side walls of the first spacer 320 constitute the main spacer structure layer.

The process of removing the first core layers is the same as that in the aforementioned embodiments, and is omitted in some implementations.

In some implementations, before the second spacers are formed, the anti-etching layer is retained.

In some implementations, the first spacers 320 formed between the adjacent anti-etching layers 315 on the fourth sub-region b2 and located on side wall surfaces of the anti-etching layer 315 are in contact, the anti-etching layers 315 can be retained in the step of removing the first core layers, the side walls of the first spacers 320 in contact are not exposed, and therefore, the second spacers may not be formed on the side walls of the first spacers 320 in contact on the fourth sub-region b2.

In some implementations, in the process of forming the main spacer structure layers, additional spacer structure layers 335e are also formed on the fourth sub-region b2, and any one of the additional spacer structure layers 335e includes first spacers 320 in contact located on the fourth sub-space region.

The additional spacer structure layers 335e are also configured to serve as masking films for patterning the bottom core material layer to form the second core layers subsequently. Therefore, the bottom core material layer 304 is patterned by using the main spacer structure layers and the additional spacer structure layers 335e as masking films to form the second core layers subsequently.

In some implementations, the width dimension of the additional spacer structure layer 335e is different from the width dimensions of the first type spacer structure layer, the second type spacer structure layer, the third type spacer structure layer and the fourth type spacer structure layer described above.

Accordingly, after the bottom core material layer 304 is patterned using the additional spacer structure layers 335e as the masking films to form the second core layer and the third spacers are formed on the side walls of the second core layers, a pitch between the third spacers is also different from that in the implementations described above. After the base 300 is patterned using the third spacers as the masking films to form the desired patterns, a pitch type of desired patterns different from that in the aforementioned embodiments may also be Obtained accordingly.

With reference to FIG. 29, after the second spacers are formed, before the bottom core material layer 304 is patterned, the anti-etching layer 315 is removed. Therefore, preparations are made for patterning the bottom core material layer 304 by using the additional spacer structure layers 335e as the masking films subsequently.

In some implementations, a dry etching process is adopted to remove the anti-etching layer 315.

Accordingly, after the second core layers are formed subsequently, before the third spacers are formed, the forming method of the semiconductor structure further includes that the additional spacer structure layers are removed.

In other implementations, the second region includes the third sub-regions but not the fourth sub-regions, or the second region includes the fourth sub-regions but not the third sub-regions.

For detailed description of the semiconductor structure of the implementations described below, reference may be made to the corresponding description in the implementations described above, as details are omitted here for the implementations described below.

Figure 30:
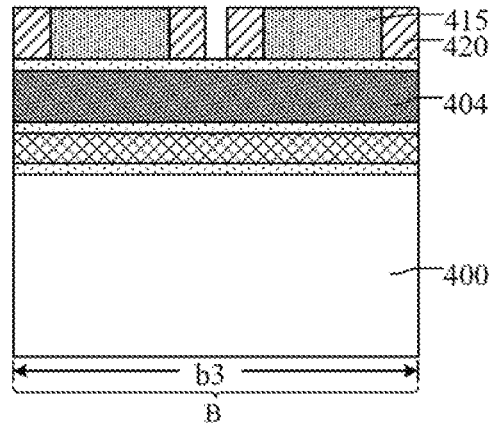
FIG. 30 to FIG. 32 are schematic structural diagrams corresponding to steps in one form of a method for forming a semiconductor structure according to the present disclosure.
Figure 31:
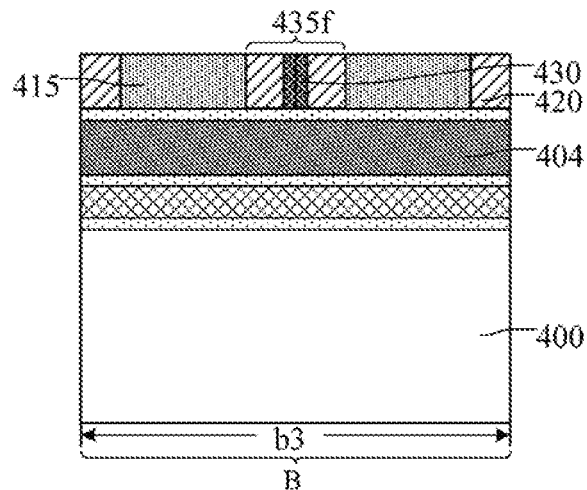
Figure 32:
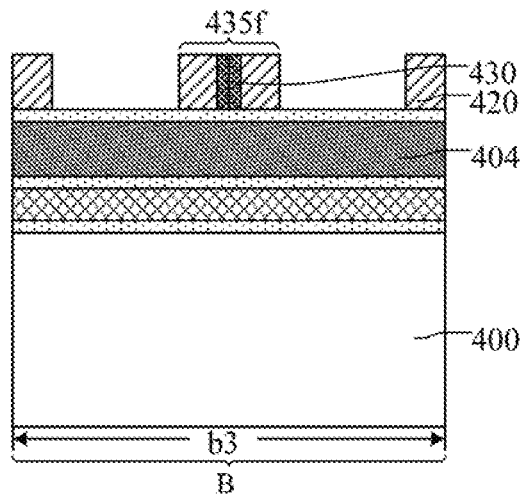

FIG. 30 to FIG. 32 are schematic structural diagrams corresponding to steps in yet another form of a forming method of a semiconductor structure according to the present disclosure.

The similarities between the implementations described above and the implementations described below are omitted here. The implementations described below are different from the implementations described above in that: the second region further includes fifth sub-regions; in the process of forming the anti-etching layer, the anti-etching layer is formed on the fifth sub-region; in the step of forming the first spacer, the first spacers formed on the side walls of the anti-etching layers of the fifth sub-regions are separate from each other; in the step of forming the second spacer, the second spacers formed between the adjacent first spacers on the fifth sub-region and located on the side wall surfaces of the first spacers are in contact; and the main spacer structure layers on the fifth sub-regions are fifth type spacer structure layers, and any one of the fifth type spacer structure layers includes two first spacers and second spacers in contact located between the two adjacent first spacers.

With reference to FIG. 30, first spacers 420 are formed on side walls of the first core layers (not shown).

In some implementations, the second region B further includes a fifth sub-region b3.

In some implementations, an anti-etching layer 415 separate from the first core layers is formed on a bottom core material layer 404 of the second region B. Specifically, in some implementations, the anti-etching layer 415 is formed on the fifth sub-region b3. Therefore, the first spacers 420 are also formed on side walls of the anti-etching layer 415.

In some implementations, the first spacers 420 formed on the side walls of the anti-etching layer 415 of the fifth sub-region b3 are separate from each other. Therefore, a gap is formed between the adjacent first spacers 420 located on side walls of the adjacent anti-etching layers 415 of the fifth sub-region b3, so that the second spacers can be formed on the side wall surfaces of the first spacers 420 on the side walls of the adjacent anti-etching layers 415 on the fifth sub-region b3.

It should be noted that, for convenience of illustration and description, only a schematic structural diagram of the fifth sub-region b3 in the second region B corresponding to steps in the forming method of the semiconductor structure in some implementations is illustrated.

With reference to FIG. 31, after the first spacers 420 are formed, the first core layers are removed. After the first core layers are removed, second spacers 430 are formed on side walls of the first spacers 420. The first spacers 420 and the second spacers 430 located on the side walls of the first spacers 420 constitute the main spacer structure layer.

In some implementations, before the second spacers 430 are formed, the anti-etching layer 415 is retained.

In some implementations, since the anti-etching layer 415 can be retained in the step of removing the first core layers, in the step of forming the second spacers 430, the second spacer 430 is not formed on the side wall surface where the first spacer 420 of the second region 13 is in contact with the anti-etching layer 415.

In some implementations, the second spacers 430 formed between the adjacent first spacers 420 on the fifth sub-region b3 and located on side wall surfaces of the first spacers 420 are in contact. That is, the gap between the side walls of the adjacent first spacers 420 located on the side walls of the adjacent anti-etching layers 415 on the fifth sub-region b3 is fully filled with the second spacers 430.

Therefore, in some implementations, the main spacer structure layers on the fifth sub-regions b3 are fifth type spacer structure layers 435f, and any one of the fifth type spacer structure layers 435f includes two adjacent first spacers 420 and second spacers 430 in contact located between side walls of the two adjacent first spacers 420.

The width dimension of the fifth type spacer structure layer 435f is different from the width dimensions of the first type spacer structure layer, the second type spacer structure layer, the third type spacer structure layer, the fourth type spacer structure layer and the additional spacer structure layer described above, thereby further increasing the types of width dimensions of the spacer structure layers, accordingly increasing the types of pitches of the desired patterns formed in the base 400 subsequently, and further increasing the degree of freedom in designing the types of pitches of the desired patterns.

In some implementations, in the step of forming the second spacers 430, a width of the second spacers 430 that are formed on the side walls of the first spacers 420 and are separate from each other is defined as a third width.

A distance between the two adjacent first spacers 430 in the fifth type spacer structure layer 435f may be less than or equal to twice the third width.

With reference to FIG. 32, after the second spacers 430 are formed, before the bottom core material layer 404 is patterned, the anti-etching layer 415 is removed. The step of removing the anti-etching layer 415 is the same as that in the aforementioned embodiments, and is omitted here.

In other implementations, the second region includes any one or a combination of two of the third sub-region, the fourth sub-region and the fifth sub-region.

For detailed description of the forming method of the semiconductor structure of the present embodiment, reference may be made to the corresponding description in the foregoing embodiments, and details are omitted here in some implementations.

Figure 33:
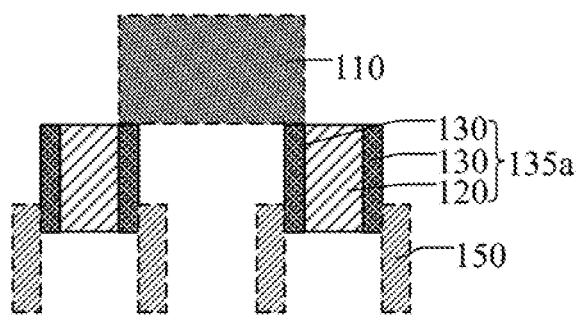
FIG. 33 is a schematic structural diagram of one form of a first type spacer structure layer in a semiconductor structure of the present disclosure.
Figure 34:
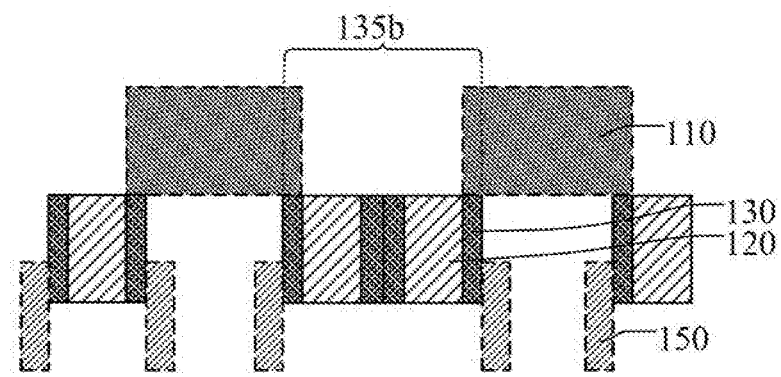
FIG. 34 is a schematic structural diagram of one form of a second type spacer structure layer in a semiconductor structure of the present disclosure.
Figure 35:
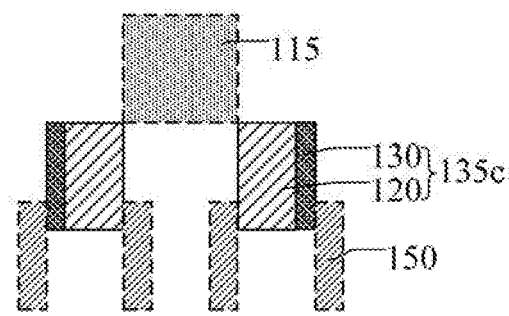
FIG. 35 is a schematic structural diagram of one form of a third type spacer structure layer in a semiconductor structure of the present disclosure.

Accordingly, the present disclosure further provides a semiconductor structure. With reference to FIG. 20, a schematic structural diagram of one form of a semiconductor structure of the present disclosure is shown. With reference to FIG. 33 in combination, a schematic structural diagram of one form of a first type spacer structure layer in a semiconductor structure of the present disclosure is shown. With reference to FIG. 34 in combination, a schematic structural diagram of one form of a second type spacer structure layer in a semiconductor structure of the present disclosure is shown. With reference to FIG. 35 in combination, a schematic structural diagram of one form of a third type spacer structure layer in a semiconductor structure of the present disclosure is shown.

The semiconductor structure includes: a base 100, including a first region A; a bottom core material layer 104, located on the base 100; a plurality of first spacers 120, located on the bottom core material layer 104; a second spacer 130; located on a side wall of the first spacer 120, where the first spacer 120 and the second spacer 130 located on the side wall of the first spacer 120 constitute a main spacer structure layer, and the main spacer structure layer is configured to serve as a masking film for patterning the bottom core material layer 104.

The main spacer structure layer is configured to serve as the masking film for etching the bottom core material layer 104 to form the second core layer, a subsequent step further includes forming the third spacer 150 on the side wall of the second core layer, the third spacer 150 is configured to serve as the masking film for patterning the base 100 to form the desired pattern, and therefore, the dimension of the main spacer structure layer is configured to define a pitch between the third spacers 150, thereby defining a pitch between the desired patterns. In some implementations, by disposing the first spacer 120 and the second spacer 130 to constitute the main spacer structure layer, different types of dimensions of main spacer structure layers can be obtained by adjusting the dimensions of the first spacer 120 and the second spacer 130 and the positional relationship between the first spacer 120 and the second spacer 130, thereby meeting the demand of different types of pitches between the formed desired patterns, and accordingly increasing the degree of freedom in designing the types of pitches of the desired patterns. Moreover, obtaining different types of the main spacer structure layers by adjusting the dimensions of the first spacer 120 and the second spacer 130 and the positional relationship between the first spacer 120 and the second spacer 130 is also beneficial to reducing the difficulty in accurately controlling the pitch between the desired patterns.

The base 100 is a layer to be etched in a patterning process, and the base 100 also provides a process platform for the technical manufacturing process.

In some implementations, the base 100 includes a first region A and a second region B.

In some implementations, the first region A and the second region B being adjacent to each other is taken as an example. In other implementations, the first region and the second region may not be adjacent.

In some implementations, the first region A includes a first sub-region a1, the first sub-region a1 includes first sub-core regions (not labeled) and first sub-space regions (not labeled) located between the adjacent first sub-core regions, and the first sub-core region is configured to define a position of the first core layer subsequently formed on the first sub-core region.

In other implementations, the base may include only the first region but not the second region.

In some implementations, the second region B includes a third sub-region b1.

In some implementations, a material of the base 100 is silicon.

In some implementations, the base 100 is configured to form a substrate and fins protruding from the substrate, that is, the formed desired patterns are the fins. In other implementations, the base may also be configured to form other types of patterns, such as interconnection trenches. Accordingly, in some implementations, the base further includes a metal interlayer dielectric layer. The metal interlayer dielectric layer in the base is configured to serve as a layer to be treated in the patterning process.

The semiconductor structure further includes: a pad oxide layer 101, located between the base 100 and the bottom core material layer 104; and a polishing stop layer 102, located between the pad oxide layer 101 and the bottom core material layer 104.

A top surface of the polishing stop layer 102 is configured to define a stop position of a polishing process of forming an isolation structure subsequently. Moreover, subsequently, patterns of the main spacer structure layers may be firstly transferred into the polishing stop layer 102, and then transferred into the base 100 through the polishing stop layer 102, which is beneficial to improving the process stability of patterning the base 100. In some implementations, a material of the polishing stop layer 102 is silicon nitride.

The pad oxide layer 101 is configured to provide a cushioning effect when the polishing stop layer 102 is formed. In some implementations, a material of the pad oxide layer 101 is silicon oxide.

The semiconductor structure further includes: a first etch stop layer 103, located between the polishing stop layer 102 and the bottom core material layer 104. In some implementations, a material of the first etch stop layer 103 is silicon oxide.

The bottom core material layer 104 is located on the first region A and the second region B of the base 100.

The bottom core material layer 104 is configured to form a second core layer subsequently. Third spacers 150 subsequently formed on side walls of the second core layers are configured to serve as masking films for patterning the base 100.

In some implementations, a material of the bottom core material layer 104 is amorphous silicon.

The semiconductor structure further includes: a second etch stop layer 105 located on the bottom core material layer 103.

The first spacer 120 and the second spacer 130 are both formed by deposition and etching, and the second etch stop layer 105 can define an etch stop position in the etching processes of forming the first spacer 120 and the second spacer 130 so as to avoid the problem of over-etching, thereby reducing the probability that the height of the top surface of the bottom core material layer 104 is not uniform. In some implementations, a material of the second etch stop layer 105 is silicon oxide.

The first spacer 120 is configured to serve as a portion of the masking film for patterning the bottom core material layer 104 subsequently.

The first spacer 120 also provides a support function for forming the second spacer 130.

In some implementations, a material of the first spacer 120 is titanium oxide.

The second spacer 130 is configured to constitute a main spacer structure layer together with the first spacer 120, and the main spacer structure layer is configured to serve as a masking film for patterning the bottom core material layer 104 to form the second core layers.

A material of the second spacer 130 includes titanium oxide, titanium nitride, silicon nitride, aluminum oxide or silicon oxide.

In some implementations, the material of the second spacer 130 is the same as the material of the first spacer 120. The material of the second spacer 130 is titanium oxide to avoid introducing other spacer materials, thereby being beneficial to improving the process compatibility and reducing the process changes. Moreover, the main spacer structure layer may include only one material, which is beneficial to improving the process effect of etching the bottom core material layer 104 by using the main spacer structure layer as the masking film subsequently and improving the accuracy of pattern transfer.

In some implementations, the first region A includes a first sub-region a1, and the first sub-region a1 has a plurality of first spacers 120 and a plurality of second spacers 130 thereon.

In some implementations, the first spacers 120 on the first sub-region a1 are separate, and the second spacers 130 are respectively located on side walls on two sides of the first spacer 120.

In some implementations, the main spacer structure layers on the first sub-region a1 include first type spacer structure layers 135a and second type spacer structure layers 135b, and the first type spacer structure layers 135a and the second type spacer structure layers 135b are separate from each other.

In some implementations, any one of the first type spacer structure layers 135a includes one first spacer 120 and second spacers 130 located on side wall surfaces on two sides of the first spacer 120.

When the number of the first type spacer structure layers 135a is plural, the first type spacer structure layers 135a are separate from each other.

With reference to FIG. 33 in combination, the first type spacer structure layer 135a includes one first spacer 120 and second spacers 130 located on side wall surfaces on two sides of the first spacer 120, because the first spacers 120 are formed on the first core layers 110, and in the step of forming the first spacers 120, the first spacers 120 on side walls of the first core layers 110 are separate from each other; and the first core layers 110 are removed subsequently, the second spacers 130 are formed on the side walls of the first spacers 120, and the second spacers 130 on the side walls of the first spacers 120 are separate from each other.

Accordingly, the bottom core material layer 104 is patterned using the first type spacer structure layers 135a as masking films to form second core layers subsequently. Third spacers 150 are formed on side walls of the second core layers, and the third spacers 150 have a first type pitch therebetween. Subsequently, the second core layers are removed, the base 100 is patterned by using the third spacers 150 as masking films to form the desired patterns, and the desired patterns also have the first type pitch therebetween.

In some implementations, any one of the second type spacer structure layers 135b includes two adjacent first spacers 120 and second spacers 130 respectively located on side wall surfaces on two sides of each first spacer 120, and for any one of the second type spacer structure layers 135b, the second spacers 130 located on the side walls of the first spacers 120 between the adjacent first spacers 120 are in contact.

When the number of the second type spacer structure layer 135b is plural, the second type spacer structure layers 135b are separate from each other.

With reference to FIG. 34 in combination, the second type spacer structure layer 135b includes two adjacent first spacers 120 and second spacers 130 respectively located on two side wall surfaces of each first spacer 120, and the second spacers 130 located on side walls of the first spacers 120 between the adjacent first spacers 120 are in contact, because the first spacers 120 are separate from each other when the first spacers 120 are formed on side walls of the first core layers 110; and after the first core layers 110 are removed, when the second spacers 130 are formed on the side walls of the first spacers 120, the second spacers 130 located on the side walls of the first spacers 120 between the adjacent first spacers 120 are in contact.

Compared with the first type spacer structure layer 135a, the second type spacer structure layer 135b is wider. The second type spacer structure layer 135b and the first type spacer structure layer 135a have different width dimensions, so that the main spacer structure layers have different types of width dimensions, and the desired patterns subsequently formed accordingly have different pitches therebetween.

In some implementations, the base 100 further includes a second region B, and the second region B includes third sub-regions b1. The third sub-region b1 has first spacers 120 and second spacers 130 thereon.

In some implementations, the main spacer structure layers on the third sub-region b1 are the third type spacer structure layers 135c, and any one of the third type spacer structure layers 135c includes one first spacer 120 and a second spacer 130 located on a side wall surface on one side of the first spacer 120.

With reference to FIG. 35 in combination, in some implementations, any one of the third type spacer structure layers 135c includes one first spacer 120 and a second spacer 130 located on a side wall surface on one side of the first spacer 120, because when the second spacer 130 is formed, the two first spacers 120 of the third sub-region b1 are respectively formed on two side wall surfaces of the anti-etching layer 115. An etching resistance of the anti-etching layer 115 is greater than an etching resistance of the first core layer 110, so that the anti-etching layer 115 can be retained in the step of removing the first core layers 110.

Compared with the first type spacer structure layer 135a, the third type spacer structure layer 135c has a smaller width dimension, that is, the width dimension of the third type spacer structure layer 135c is different from the width dimensions of the first type spacer structure layer 135a and the second type spacer structure layer 135b, so that more types of width dimensions of the main spacer structure layers can be obtained by retaining the anti-etching layer 115 in the process of forming the second spacer 130, and thus, the desired patterns subsequently formed has different types of pitches therebetween.

With reference to FIG. 27, a schematic structural diagram of another embodiment of a semiconductor structure of the present disclosure is shown.

The similarities between the present embodiment and the aforementioned embodiments are omitted here. The present embodiment is different from the foregoing embodiments in that: the first region A further includes second sub-regions a2; the main spacer structure layers on the second sub-regions a2 are fourth type spacer structure layers 235d, any one of the fourth type spacer structure layers 235*d* includes second spacers 230 and two first spacers 220 in contact, and the second spacers 230 are respectively located on side wall surfaces on two sides of the two first spacers 220 in contact as a whole.

In some implementations, the width dimension of the fourth type spacer structure layer 235*d* is different from the width dimensions of the first type spacer structure layer, the second type spacer structure layer and the third type spacer structure layer, thereby further increasing the types of width dimensions of the main spacer structure layers.

Figure 36:
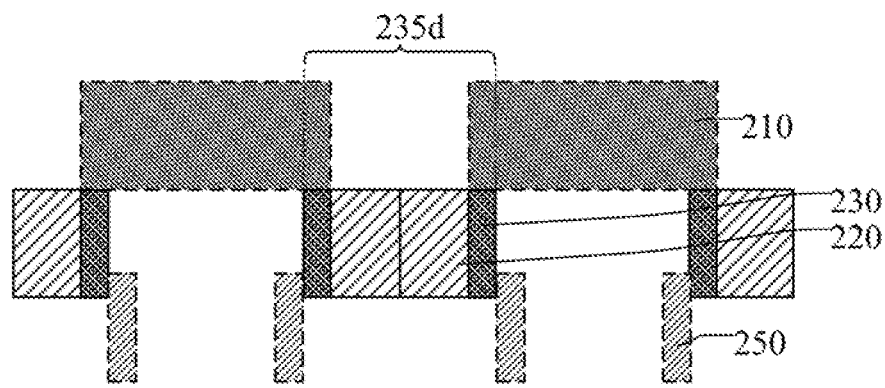
FIG. 36 is a schematic structural diagram of one form of a fourth type spacer structure layer in a semiconductor structure of the present disclosure.

With reference to FIG. 36 in combination, a schematic structural diagram of some implementations of the fourth type spacer structure layer 235*d* in a semiconductor structure of the present disclosure is shown. In some implementations, the fourth type spacer structure layer 235*d* includes second spacers 230 and two first spacers 220 in contact, and the second spacers 230 are respectively located on the side wall surfaces on two sides of the two first spacers 220 in contact as a whole, because in the step of forming the first spacers 220, the first spacers 220 are formed on side walls of the first core layers 210 (shown as dashed boxes in FIG. 36), the first core layers 210 are removed subsequently, and the second spacers 230 are formed on the side walls of the first spacers 220.

Therefore, in some implementations, by controlling the pitch between the adjacent first core layers 210 and the thickness of the first spacers 220, when the first spacers 220 are formed, the first spacers 220 formed between the adjacent first core layers 210 on the second sub-region a2 and located on the side wall surfaces of the first core layers 210 are in contact.

Accordingly, after the bottom core material layer 204 is patterned by using the fourth type spacer structure layers 235*d* as the masking films to form the second core layers and the third spacers 250 (shown as dashed boxes in FIG. 36) are formed on the side walls of the second core layers, a pitch between the third spacers 250 is also different from the pitch between the third spacers in the aforementioned embodiments, so that the subsequent desired patterns have more types of pitches.

With reference to FIG. 29, a schematic structural diagram of another form of a semiconductor structure of the present disclosure is shown.

The similarities between the implementations described below and the implementations described above are not repeated here. The implementations described below are different from the implementations described above in that: the second region B further includes fourth sub-regions b2; the fourth sub-region b2 has first spacers 320 thereon; and the fourth sub-region b2 has additional spacer structure layers 335*e* thereon, and any one of the additional spacer structure layers 335*e* includes two first spacers 320 in contact.

The additional spacer structure layers 335*e* are also configured to serve as masking films for patterning the bottom core material layer to form the second core layers subsequently. The additional spacer structure layer 335*e* includes only the two first spacers 320 in contact, so that the width dimension of the additional spacer structure layer 335*e* is different from the width dimensions of the first type spacer structure layer, the second type spacer structure layer, the third type spacer structure layer and the fourth type spacer structure layer described above.

Figure 37:
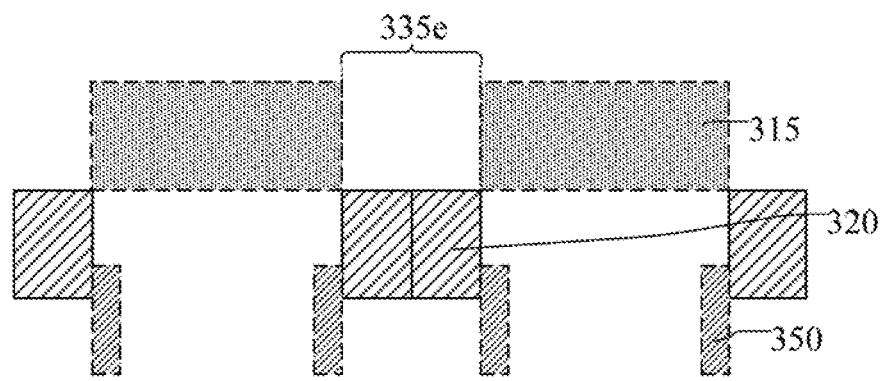
FIG. 37 is a schematic structural diagram of one form of an additional spacer structure layer in a semiconductor structure of the present disclosure.

With reference to FIG. 37 in combination, a schematic structural diagram of some implementations of the additional spacer structure layer 335*e* in a semiconductor structure of the present disclosure is shown. In some implementations, the additional spacer structure layer 335*e* includes only the two first spacers 320 in contact, because when the first spacers 320 are formed, the first spacers 320 located between adjacent anti-etching layers 315 on the fourth sub-region b2 and located on the side wall surfaces of the anti-etching layers 315 are in contact, and when the first core layers are removed, the anti-etching layer 315 is retained, so that in the step of forming the second spacers, the second spacers may not be formed on the side walls of the first spacers 320 in contact on the fourth sub-region b2 since the side walls of the first spacers 320 in contact are not exposed.

Accordingly, after the bottom core material layer 304 is patterned using the additional spacer structure layers 335*e* as the masking films to form the second core layers and the third spacers 350 are formed on the side walls of the second core layers subsequently, the third spacers 350 also have different pitches therebetween, so that the desired patterns also have different types of pitches therebetween.

With reference to FIG. 32, a schematic structural diagram of yet another form of a semiconductor structure of the present disclosure is shown.

The similarities between the implementations described below and the implementations described above are not repeated here. The implementations described below are different from the implementations described above in that: the second region B further includes fifth sub-regions b3; the fifth sub-region b3 has first spacers 420 and second spacers 430 thereon; and the main spacer structure layers on the fifth sub-regions b3 are fifth type spacer structure layers 435*f*; and any one of the fifth type spacer structure layers 435*f* includes two adjacent first spacers 420 and second spacers 430 in contact located between the two adjacent first spacers 420.

The width dimension of the fifth type spacer structure layer 435*f* is different from the width dimensions of the first type spacer structure layer, the second type spacer structure layer, the third type spacer structure layer, the fourth type spacer structure layer and the additional spacer structure layer described above, thereby further increasing the types of width dimensions of the spacer structure layers, accordingly increasing the types of pitches of the subsequent third spacers 450, further increasing the types of pitches of the desired patterns formed in the base 400, and increasing the degree of freedom in designing the types of pitches of the desired patterns.

Figure 38:
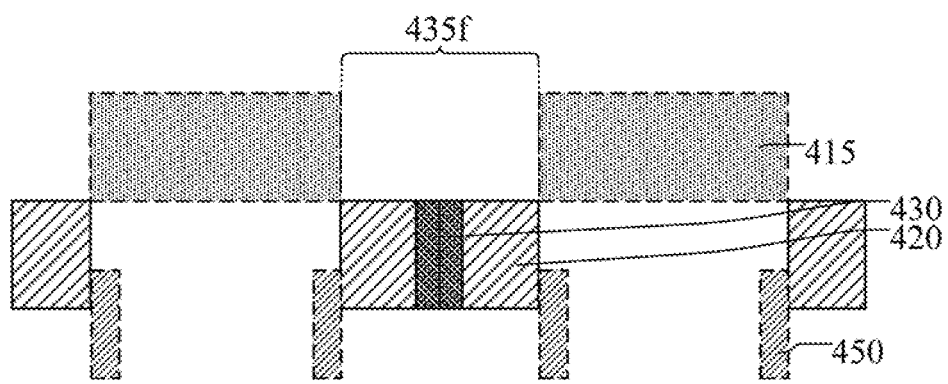
FIG. 38 is a schematic structural diagram of one form of a fifth type spacer structure layer in a semiconductor structure of the present disclosure.

With reference to FIG. 38 in combination, a schematic structural diagram of one form of the fifth type spacer structure layer 435*f* in a semiconductor structure of the present disclosure is shown. In some implementations, the fifth type spacer structure layer 435*f* includes two adjacent first spacers 420 and second spacers 430 in contact located between the two adjacent first spacers 420, because: when the first spacers 420 are formed, the first spacers 420 located on the side walls of the anti-etching layers 415 of the fifth sub-region b3 are separate from each other, and the etching resistance of the anti-etching layer 415 is greater than the etching resistance of the first core layer, so that the anti-etching layer 415 can be retailed when the first core layers are removed; and therefore, when the third spacers 430 are formed on the side walls of the second spacers 420, the third spacers 430 are formed only on the side walls of the adjacent first spacers 420 exposed by the anti-etching layers 415, and the second spacers 430 formed between the adjacent first spacers 420 on the fifth sub-region b3 and located on the side wall surfaces of the first spacers 420 are in contact.

The semiconductor structure may be formed by adopting the forming method described in the implementations described above, or may be formed by adopting other forming methods. For detailed description of the semiconductor structure of the present implementations, reference may be made to the corresponding description in the implementations described above, as details are omitted here.

Although the present disclosure is disclosed as above, the present disclosure is not thereto. A person skilled in the art may make variations and modifications without departing from the spirit and scope of the present disclosure. Therefore, the protection scope of the present disclosure should be subject to the claims.

What is claimed is:

1. A forming method of a semiconductor structure, comprising:
   providing a base, wherein the base comprises a first region;
   forming a bottom core material layer on the base;
   forming separate first core layers on the bottom core material layer of the first region;
   forming a first spacer on a side wall of a first core layer of the separate first core layers;
   after forming the first spacer, removing the first core layer;
   after removing the first core layer, forming a second spacer on a side wall of the first spacer, wherein the first spacer and the second spacer located on the side wall of the first spacer constitute a main spacer structure layer;
   patterning the bottom core material layer using the main spacer structure layer as a masking film to form a second core layer;
   after forming the second core layer, removing the main spacer structure layer;
   after removing the main spacer structure layer, forming a third spacer on a side wall of the second core layer;
   after forming the third spacer, removing the second core layer; and
   after removing the second core layer, patterning the base using the third spacer as a masking film to form a desired pattern.

2. The forming method of the semiconductor structure according to claim 1, wherein:
   the base further comprises a second region; and
   the forming method of the semiconductor structure further comprises:
      forming an anti-etching layer separate from the first core layers on the bottom core material layer of the second region, wherein an etching resistance of the anti-etching layer is greater than an etching resistance of the first core layers; and
      forming another first spacer on a side wall of the anti-etching layer;
      wherein before forming the second spacer, the anti-etching layer is retained;
      wherein after forming the second spacer on the side wall of the first spacer, another main spacer structure layer is also located on the second region; and
      wherein after forming the second spacer and before patterning the bottom core material layer, the anti-etching layer is removed.

3. The forming method of the semiconductor structure according to claim 1, wherein:
   the first region comprises first sub-regions, each first sub-region comprising first sub-core regions and first sub-space regions located between adjacent first sub-core regions, where each first sub-core region is configured to define a position of the first core layer on the first sub-core region;
   forming the first spacer comprises forming a first spacer on a side wall of each first core layer of the separate first core layers, where the first spacers formed on the side walls of the first core layers of the first sub-regions are separate from each other; and
   forming the second spacer comprises forming a second spacer on each of the first spacers, where the second spacers formed on the first sub-core regions are separate from each other, and the second spacers formed on the same first sub-space region are in contact.

4. The forming method of the semiconductor structure according to claim 3, wherein:
   main spacer structure layers on the first sub-regions are respectively first type spacer structure layers and second type spacer structure layers, and the first type spacer structure layers and the second type spacer structure layers are separate from each other;
   each of the first type spacer structure layers comprises one first spacer and second spacers located on side wall surfaces on two sides of that first spacer; and
   each of the second type spacer structure layers comprises two adjacent first spacers and second spacers respectively located on the side wall surfaces on two sides of each of the two adjacent first spacers, and the second spacer between the adjacent first spacers corresponds to the second spacer on the first sub-space region.

5. The forming method of the semiconductor structure according to claim 3, wherein:
   the first region comprises second sub-regions;
   the plurality of first core layers is formed on the second sub-regions;
   the first spacers formed between adjacent first core layers on the second sub-regions and located on side wall surfaces of the first core layers are in contact; and
   main spacer structure layers on the second sub-regions are fourth type spacer structure layers, each fourth type spacer structure layers comprises the second spacer and two first spacers in contact, and the second spacers are respectively located on side wall surfaces on two sides of the two first spacers in contact as a whole.

6. The forming method of the semiconductor structure according to claim 2, wherein:
   the second region comprises third sub-regions;
   the anti-etching layer is formed on the third sub-regions;
   first spacers formed on side walls of the anti-etching layer of the third sub-regions are separate from each other;
   second spacers formed on side walls of the first spacers of the third sub-regions are separate from each other; and
   main spacer structure layers on the third sub-regions are third type spacer structure layers, and any one of the third type spacer structure layers comprises one first spacer and one second spacer located on a side wall surface on one side of the one first spacer.

7. The forming method of the semiconductor structure according to claim 2, wherein:
   the second region comprises fourth sub-regions, each of the fourth sub-regions comprises fourth sub-anti-etching regions and a fourth sub-space region located between adjacent fourth sub-anti-etching regions, and the fourth sub-anti-etching region are configured to define a position of the anti-etching layer on the fourth sub-anti-etching regions;
   first spacers formed between adjacent anti-etching layers on the fourth sub-regions and located on side wall surfaces of the anti-etching layers are in contact;
   additional spacer structure layer are also formed on the fourth sub-regions, and any one of the additional spacer structure layers comprises the first spacers in contact on the fourth sub-space region;

the bottom core material layer is patterned by using the main spacer structure layer and the additional spacer structure layers as masking films to form the second core layer; and after forming the second core layer, before forming the third spacer, the method further comprises: removing the additional spacer structure layers.

8. The forming method of the semiconductor structure according to claim 2, wherein:

the second region comprises fifth sub-regions;

anti-etching layers are formed on the fifth sub-regions;

first spacers formed on the side walls of the anti-etching layers of the fifth sub-regions are separate from each other;

second spacers formed between adjacent first spacers on the fifth sub-regions and located on side wall surfaces of the first spacers are in contact; and main spacer structure layers on the fifth sub-regions are fifth type spacer structure layers, and any one of the fifth type spacer structure layers comprises two adjacent first spacers and the second spacers in contact located between the two adjacent first spacers.

9. The forming method of the semiconductor structure according to claim 2, further comprising:

forming an anti-etching material layer located on the second region and a top core material layer located on the first region on the bottom core material layer, wherein an etching resistance of the anti-etching material layer is greater than an etching resistance of the top core material layer; and patterning the top core material layer and the anti-etching material layer, wherein the remaining top core material layer serves as the first core layer, and the remaining anti-etching material layer serves as the anti-etching layer.

10. The forming method of the semiconductor structure according to claim 9, further comprising:

forming an initial core material layer on the bottom core material layer; and performing an ion doping treatment on the initial core material layer of the second region, thus being suitable for increasing an etching resistance of the initial core material layer of the second region, wherein the initial core material layer doped with ions that is located on the second region serves as the anti-etching material layer, and the initial core material layer not doped with ions that is located on the first region serves as the top core material layer; or performing the ion doping treatment on the initial core material layer of the first region, thus being suitable for decreasing an etching resistance of the initial core material layer of the first region, wherein the initial core material layer doped with ions that is located on the first region serves as the top core material layer, and the initial core material layer not doped with ions that is located on the second region serves as the anti-etching material layer.

11. The forming method of the semiconductor structure according to claim 2, wherein a material of the anti-etching layer comprises amorphous silicon, silicon nitride, amorphous germanium, silicon oxide, silicon oxynitride, carbon nitride, polysilicon, silicon carbide, silicon carbonitride or silicon oxycarbonitride.

12. The forming method of the semiconductor structure according to claim 10, further comprising:

performing the ion doping treatment on the initial core material layer of the second region, thus being suitable for increasing the etching resistance of the initial core material layer of the second region; and wherein the first core layer is removed with a wet etching process, wherein an etching solution of the wet etching process comprises an SC1 solution, an SC2 solution or a TMAH solution.

13. The forming method of the semiconductor structure according to claim 1, wherein the base is patterned by using third spacers as masking films to form fins or interconnection trenches.

* * * * *